United States Patent [19]

Kelly

[11] Patent Number: 5,754,074
[45] Date of Patent: May 19, 1998

[54] PROTECTED SWITCH

[75] Inventor: Brendan P. Kelly, Stockport, England

[73] Assignee: U. S. Philips Corporation, New York, N.Y.

[21] Appl. No.: 565,703

[22] Filed: Nov. 30, 1995

[30] Foreign Application Priority Data

Dec. 7, 1994 [GB] United Kingdom ............ 9424666

[51] Int. Cl.$^6$ ................................................ H03K 17/687
[52] U.S. Cl. .......................... 327/434; 327/372; 327/427; 323/292; 323/266; 361/90; 361/91
[58] Field of Search ............................ 327/372, 427, 327/434, 538; 323/292, 266, 268, 311; 361/90, 91

[56] References Cited

U.S. PATENT DOCUMENTS

| 4,103,181 | 7/1978 | Moreau .............................. 361/86 |
| 4,691,129 | 9/1987 | Einzinger et al. .................. 307/581 |
| 4,728,826 | 3/1988 | Einzinger et al. .................. 307/571 |
| 5,028,811 | 7/1991 | Le Roux et al. ................... 307/270 |
| 5,272,399 | 12/1993 | Tihanyi et al. ................... 307/572 |

FOREIGN PATENT DOCUMENTS

| 0239862 | 2/1990 | European Pat. Off. . |
| 0239861 | 6/1990 | European Pat. Off. . |
| 0602708A | 6/1994 | European Pat. Off. . |
| 5226994 | 9/1993 | Japan ............................. H03K 17/08 |
| 5304450 | 11/1993 | Japan ............................. H03K 17/08 |
| 2257583 | 1/1993 | United Kingdom ........... H03K 17/00 |

*Primary Examiner*—Timothy P. Callahan
*Assistant Examiner*—Jung Ho Kim
*Attorney, Agent, or Firm*—Edward Blocker

[57] ABSTRACT

A protected switch has a power first semiconductor device having a first main electrode for coupling to a first voltage supply line, a second main electrode coupled to a first terminal for connection via a load to a second voltage supply line and an insulated gate electrode coupled to a control terminal for supplying a gate control signal to enable conduction of the power semiconductor device. A control arrangement has a normally off second semiconductor device having first and second main electrodes coupling the normally off semiconductor device between the gate electrode of the power semiconductor device and one of the first and second main electrodes of the power first semiconductor device and a control electrode coupled via a resistance to the gate electrode of the power semiconductor device thereby causing the normally off semiconductor device to be rendered conducting when a gate control signal is supplied to the gate electyrode to enable conduction of the power semiconductor device. A disabling arrangement including a normally off third semiconductor device inhibits conduction of the normally off semiconductor device during normal operation of the power semiconductor device.

15 Claims, 6 Drawing Sheets

PROTECTED SWITCH

BACKGROUND OF THE INVENTION

This invention relates to a protected switch where the switch is in the form of an insulated gate power semiconductor device, for example a power MOSFET, for driving a load, for example an inductive load in the electrical system of, for example, a motor vehicle.

European Patent Applications Publications Nos. 0239861 and 0239862 both describe protected switches comprising first and second voltage supply lines, a power first semiconductor device having a first main electrode coupled to the first voltage supply line, a second main electrode coupled to a first terminal for connection via a load to the second voltage supply line and an insulated gate electrode coupled to a control terminal for supplying a gate control signal to enable conduction of the power semiconductor device and a control arrangement for controlling operation of the power semiconductor device. These protected switches are both high-side switches, that is the switch is coupled between the load and the more positive one of the first and second voltage supply lines. In each case, the control arrangement comprises a second semiconductor device having first and second main electrodes and a control electrode for controlling conduction through the second semiconductor device with the second semiconductor device being coupled to the gate electrode of the power semiconductor device to provide, when rendered conducting, a discharge path to discharge the intrinsic parasitic gate capacitance of the power MOSFET during turn-off of the protected switch.

In the protected switch described in European Patent Application Publication No. 0239861, the second semiconductor device is in the form of a normally off semiconductor device, in particular an enhancement mode insulated gate field effect transistor (IGFET), and a separate control signal has to be supplied to the insulated gate of the enhancement mode IGFET in order to render it conducting to enable discharge of the parasitic capacitance during turn-off of the power MOSFET. Thus, the protected switch described in European Patent Application Publication No. 0239861 requires power to be supplied to the control circuit during turn-off of the power MOSFET resulting in a significant current consumption. These kinds of protected switches are often used as the sole switch for various types of loads within conventional vehicles fitted with lead acid rechargeable batteries and an alternator to recharge the battery during vehicle usage. In such circumstances, if such a protected switch causes an appreciable drain on the battery when the vehicle is not in use, the battery may become discharged.

In the protected switch described in European Patent Application Publication No. 0239862 the second semiconductor device is in the form of a normally on semiconductor device, in particular a depletion mode IGFET having its control or gate electrode coupled to earth and to an electronic switch which acts to inhibit conduction through the depletion mode IGFET during normal operation of the power MOSFET. This protected switch relies, however, on the properties of the depletion mode IGFET and it can be very difficult to fabricate a depletion mode IGFET which exhibits the required well-controlled conductance and, more importantly, a well-controlled precise pinch-off of the conduction channel to inhibit conduction of the depletion mode IGFET. It is especially difficult to fabricate such a good depletion IGFET which also can withstand high voltages between its main terminals and control electrode, e.g as in EP 0 239 862 using thicker gate insulator than would normally be used in a depletion IGFET.

In European Patent Application Publication No. 0239861, the normally off second semiconductor device is actually coupled between the insulated gate electrode of the power MOSFET and ground which may result in problems where the voltage at the first terminal swings below ground during the turning-off of an inductive load. In particular, this may result in undesired parasitic bipolar action where the protected switch is integrated in a single semiconductor body. Where a self-isolated technology is used then often a thicker semiconductor epitaxial layer may be required and the power MOSFET may have a poorer specific on-resistance (Rds(on)).

SUMMARY OF THE INVENTION

According to a first aspect of the present invention, there is provided a protected switch comprising a power first semiconductor device having a first main electrode for coupling to a first voltage supply line, a second main electrode coupled to a first terminal for connection via a load to a second voltage supply line and an insulated gate electrode coupled to a control terminal for supplying a gate control signal to enable conduction of the power first semiconductor device, and a control arrangement for controlling operation of the power first semiconductor device, wherein the control arrangement comprises a normally off second semiconductor device having first and second main electrodes coupling the normally off second semiconductor device between the insulated gate electrode and one of the first and second main electrodes of the power first semiconductor device and a control electrode coupled via a high impedance path to the insulated gate electrode of the power first semiconductor device thereby causing the normally off second semiconductor device to be rendered conducting when a gate control signal is supplied to the insulated gate electrode to enable conduction of the power first semiconductor device, and wherein the control arrangement also comprises disabling means for inhibiting conduction of the normally off second semiconductor device during normal operation of the power first semiconductor device, which disabling means comprises a normally off third semiconductor device having first and second main electrodes and a control electrode with the first and second main electrodes being coupled between the control electrode of the normally off semiconductor device and the second main electrode of the power semiconductor device, and means for supplying a signal to the control electrode of the third semiconductor device for rendering the third semiconductor device conducting during normal operation of the power semiconductor device, so inhibiting conduction of the normally off second semiconductor device.

A protected switch in accordance with the first aspect of the invention thus enables the use of a normally on device as the second semiconductor device to be avoided and moreover allows for there to be a negligible or virtually zero off-state current consumption in the protected switch.

As used herein the term "protected switch" means a switch comprising a power semiconductor device and a control arrangement for controlling, at least to some extent, the operation of the power semiconductor device.

As used herein the term "normally on" means a device having at least first and second main electrodes and a control electrode which device is conducting when appropriate voltages are applied to the main electrodes but no voltage (that is zero volts) is applied to the control electrode and which can only be turned off by actually applying a non-zero voltage to the control electrode. Generally, a normally on semiconductor device will be a depletion mode IGFET or a device derived from a depletion mode IGFET. However, any suitable normally on device such as a JFET or a device having both JFET and depletion mode IGFET characteristics may be used.

As used herein the term "normally off" is intended to mean a device having at least first and second main electrodes and a control electrode, which device is not rendered conducting when appropriate voltages are applied to the main electrodes until a non-zero voltage is also applied to the control electrode. Typically, the normally off device may be an enhancement mode IGFET or related device but it could also be a bipolar transistor or similar structure of the appropriate polarity .

It may be noted that a protected switch is known from United States patent U.S. Pat. No. 5,272,399, having a control arrangement for limiting the load current flowing through a power MOSFET device. This known control arrangement comprises a current mirroring FET (2 in its drawings) having channel conduction characteristics with the same dependency on fabrication processes as the equivalent characteristics of the power device (1). The drain and gate terminals of this mirroring FET (2) are connected respectively to the drain and gate terminals of the power device (1), and a sense resistor (11) is connected between the source of the mirroring FET (2) at a node (12) and the source of the power device (1) at its connection to the load (7). The mirroring FET (2) and resistor (11) are described as a voltage divider (2,11) connected between the source and drain electrodes of the power device, such that the voltage at their node (12) follows the drain-to-source voltage of the power device (1). The control arrangement also comprises a normally off second FET (3) which is coupled between the insulated gate (G) and main source electrode (S) of the power device (1). If the voltage at the node (12) exceeds a predetermined value, this second FET (3) is rendered conducting by a series arrangement (4,5) of a resistor (5) and normally on FET (4) coupled between the node (12) and the gate (G) of the power device (1), the node of the resistor (5) and normally on FET (4) being connected to the gate (G) of the second FET (3). The control electrode (i.e gate G) of the normally on FET (4) is connected to the main source electrode (S) of the power device (1).

The circuit of U.S. Pat. No. 5,272,399 is intended and able only to restrict the current flow in the power device (1) by allowing partial conduction of the control FET (3). The depletion mode FET (4) is normally conducting and can only be rendered less-conducting by significant voltages developed at node (12). Moreover the circuit of U.S. Pat. No. 5,272,399 cannot provide for completely disabling the control FET (3), since the lowest potential which can be applied to the gate of control FET (3) is defined by the voltage at node (12) which is present due to the current in the power device (1) and the lowest gate voltage of control FET (3) is further restricted by the potential divider formed in one part by the sense resistor (11) and the channel resistance of the depletion FET (4) and in the other part by the series resistances (6) and (5).

The present invention relates to a more versatile control arrangement for a power device, in which conduction of the normally off second device is inhibited by disabling means comprising a normally off third semiconductor device with its first and second main electrodes being coupled between the control electrode of the normally off second semiconductor device and the second main electrode of the power semiconductor device. A signal is supplied to the control electrode of this third semiconductor device for rendering the third semiconductor device conducting during normal operation of the power semiconductor device, so disabling the normally off second semiconductor device. Such an arrangement of this normally off third device in accordance with the invention permits the second semiconductor device to be switched fully into its conducting and non-conducting states as a direct response to a supplied signal regardless of the current which may be initially flowing in the power semiconductor device. As a further advantage the present invention does not require any normally-on or depletion mode devices, and the complete protected power switch can be fabricated with a simpler and more cost effective process than would be needed to also fabricate useful normally-on or depletion mode devices.

Any suitable form of normally off semiconductor device may be used for the third semiconductor device. The use of a normally off IGFET as the disabling means should have advantages in that such a device allows a very high impedance coupling between the insulated gate electrode of the power first semiconductor device and the control electrode of the normally off second IGFET so that, when the power first semiconductor device is on or conducting and the disabling means is operative to disable the normally off second semiconductor device, only a very small current will be drawn from the insulated gate electrode of the power first semiconductor device through the disabling means so that the operation of the power first semiconductor device is not significantly adversely affected by the operation of the disabling means.

A threshold adjusting device may be provided for adjusting the voltage at which the third semiconductor device is rendered conducting. This enables the threshold at which the third semiconductor device is rendered conducting to be adjusted to ensure that the third semiconductor device does not turn on to disable the second semiconductor device unless the supplying means provide the requisite signal to the control electrode of the third semiconductor device.

Where the first voltage supply line is the more positive of the first and second voltage lines, that is where the power first semiconductor device is coupled as a high-side switch, then the one main electrode will be the second main electrode, that is the source electrode in the case where the power first semiconductor device comprises a power MOSFET. Alternatively, where the second voltage supply line is the more positive of the first and second voltage supply lines, that is where the power first semiconductor device is coupled as a low-side switch, then the one main electrode will be the first main electrode.

The disabling means may also comprise respective first and second conductive paths, means for modifying the conductance of at least a part of the first path when the voltage at the first terminal is less than the voltage at the more positive one of the first and second voltage supply lines, means for modifying the conductance of at least a part of the second path when the voltage at the first terminal is greater than the voltage at the other, less positive, one of the first and second voltage supply lines, and means for comparing the voltages at respective corresponding locations on the first and second paths and for providing an output signal to disable the normally off semiconductor device when a predetermined relationship between the voltages at the respective corresponding locations is detected. By using in this way modifiable first and second conductive paths with first and second level shifters, a signal with respect to a fixed potential such as a battery potential or ground can correctly influence the state of the normally - off second semiconductor service regardless of the voltages present at the insulated gate and second main electrodes of the power first semiconductor device.

Thus, according to a second aspect, the present invention provides a protected switch comprising a power first semiconductor device having a first main electrode for coupling to a first voltage supply line, a second main electrode coupled to a first terminal for connection via a load to a second voltage supply line and an insulated gate electrode coupled to a control terminal for supplying a gate control signal to enable conduction of the power semiconductor device, and a control arrangement for controlling operation of the power semiconductor device, the control arrangement comprising a second semiconductor device for coupling the insulated gate electrode of the power semiconductor device and the first terminal, and means for inhibiting coupling of the insulated gate electrode and the second main electrode of the power semiconductor device, the inhibiting means comprising respective first and second conductive paths, means for modifying the conductance of at least a part of the first path when the voltage at the first terminal is less than the voltage at the more positive one of the first and second voltage supply lines, means for modifying the conductance of at least a part of the second path when the voltage at the first terminal is greater than the voltage at the other less positive one of the first and second voltage supply lines, and means for comparing the voltages at respective corresponding locations on the first and second paths and for providing an output signal to inhibit the coupling of the insulated gate electrode and the second main electrode of the power semiconductor device by the second semiconductor device when a predetermined relationship between the voltages at the respective corresponding locations is detected.

A protected switch in accordance with the second aspect of the invention is particularly advantageous for avoiding the use of a normally on device as the second semiconductor device and moreover allows for there to be a negligible or virtually zero off-state current consumption in the protected switch. Moreover, the fact that there is no connection between the insulated gate electrode of the power semiconductor device and the second voltage supply line should enable a high negative ring off. Also, such a protected switch provides a way for a signal with respect to a fixed potential such as a battery potential or ground correctly to influence the state of the normally off second semiconductor service regardless of the voltages present at the insulated gate and second main electrodes of the power first semiconductor device. Additionally, such a protected switch can operate correctly even with low applied battery to ground potentials, because the gate voltage swings necessary to cause a detectable change in a voltage controlled resistance in the conductive path of either of the level shifters may be very small, and much smaller than for example the voltage swings which would be required to reach the threshold of an IGFET. Thus, the circuit requires little voltage headroom between the load terminal and the respective supply line for each half of the level shifter.

A protected switch in accordance with this second aspect of the invention (and also a protected switch in accordance with the first aspect) has a further advantage. The output of the level shifter in the absence of sufficient battery to ground potential is the same state as in the absence of an input signal in that in a protected switch the power semiconductor device will be turned off. Thus if the ground terminal becomes accidentally disconnected from the negative supply rail, thereby removing the supply to any internal logical or protective circuit functions in the protective switch, then these circuit arrangements in accordance with the first and/or second aspect of the invention have the advantage that the power semiconductor device will be safely turned off to prevent any damage to the protected power switch and eliminate unintended operation of the load.

In a preferred example, the first and second conductive paths comprise first and second additional semiconductor devices respectively with each additional semiconductor device having a control electrode and a conductance dependent upon the voltage applied to the control electrode, the means for modifying the conductance of at least a part of the first path comprises means for supplying a first voltage to the control electrode of the first additional semiconductor device when the voltage at the first terminal is less than the voltage at the more positive one of the first and second voltage supply lines and the means for modifying the conductance of at least a part of the second path comprises means for supplying a second voltage to the control electrode of the second additional semiconductor device when the voltage at the first terminal is greater than the voltage at the other, less positive one, of the first and of the second voltage supply lines.

The means for supplying the first voltage to the control electrode of the first additional semiconductor device may comprise a first semiconductor switch for coupling a first current source to a first resistive element to develop the first voltage across the first resistive element when the voltage at the first terminal is less than the voltage of the voltage at the more positive one of the first and second voltage supply lines. The means for supplying a second voltage to the control electrode of the second additional semiconductor device may comprise a second semiconductor switch for coupling a second current source to a second resistive element to develop the second voltage across the second resistive element when the voltage at the first terminal is greater than the voltage at the other, less positive, one of the first and second voltage supply lines. Accordingly, small voltage drops may be detected across the respective resistive elements enabling reliable level shift operation with small supply voltages.

The second current source may be coupled to the second resistive element via a current mirror arrangement and a diode chain.

The first and second additional semiconductor device may comprise normally on devices, for example voltage controlled resistances (VCRs) constructed as depletion mode insulated gate field effect transistors. In use of such a protected switch, the additional semiconductor devices will generally have only a small voltage (100 mV for example) across them and thus are unlikely to pinch off completely. Accordingly, a wide range of process or manufacturing parameters should not prevent the protected switch from operating correctly and thus the manufacturing tolerances need not be that small or tight.

The first and second conductive paths may comprise, respectively, of a bridge having an output coupled to one of the first and second arms, generally the second arm. Where the first and second conductive paths comprise the first and second additional semiconductor devices, this should allow them to operate at low voltages close to the voltage at the first terminal. For example, the first and second arms of the bridge may each comprise a respective transistor having first and second main electrodes and a control electrode, each transistor being coupled between an auxiliary voltage supply line and the said other electrode of the power semiconductor device by a respective resistor and the associated one of the first and second additional semiconductor devices, the control electrodes of the two transistors of the bridge being coupled together, one of the two transistors being diode-connected and the output being coupled to one of the first and second main electrodes of the transistor of the said one arm.

Although the normally off second semiconductor device could be, for example, a bipolar transistor or any other suitable device which does not conduct significantly until an appropriate non-zero voltage is applied to its control electrode, generally the second semiconductor device will comprise an enhancement mode insulated gate field effect transistor.

BRIEF DESCRIPTION OF THE DRAWINGS

Embodiments of the present invention will now be described, by way of example, with reference to the accompanying drawings, in which.

It should of course be understood that the drawings are not to scale and that like reference numerals are used throughout text to refer to like parts.

DETAILED DESCRIPTION OF THE PREFERRED EMBODIMENTS

Figure 1:
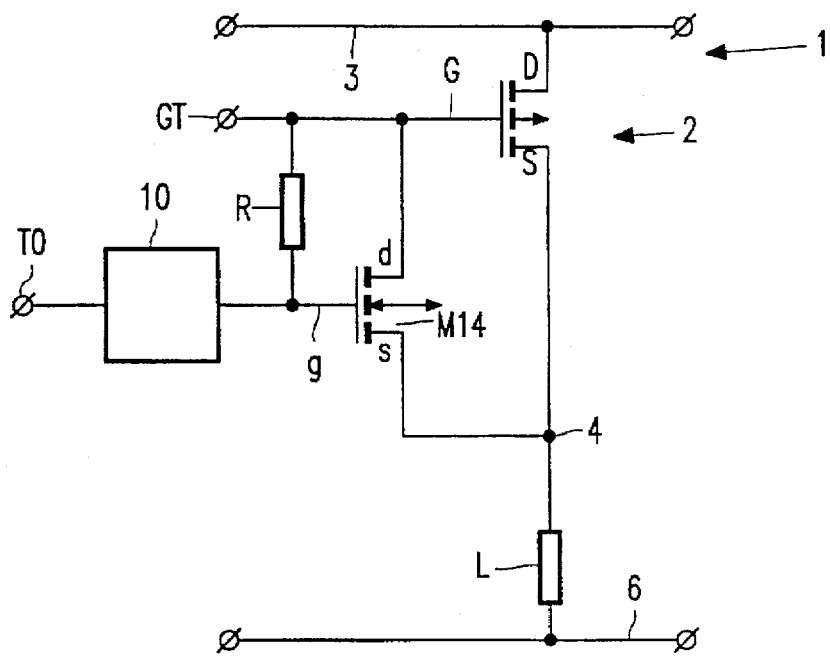
FIG. 1 is a simplified, part block schematic diagram for illustrating the present invention.

Referring now to the drawings, especially FIG. 1, 2, 3 and 10 there are illustrated protected switches 1, 1a, 1b, 1c each comprising a power first semiconductor device 2 having a first main electrode (D in FIGS. 1 to 3, S in FIG. 10) coupled to a first voltage supply line 3, a second main electrode (S in FIGS. 1 to 3, D in FIG. 10) coupled to a first terminal 4 for connection via a load L to a second voltage supply line 6 and an insulated gate electrode G coupled to a control terminal GT for supplying a gate control signal to enable conduction of the power first semiconductor device 2. The supply lines 3 and 6 may be, for example, part of an electrical system of a motor vehicle. The load L may be, for example, a lamp or other electrical component of the motor vehicle. A control arrangement for controlling operation of the power first semiconductor device is included in the switch. The control arrangement comprises a normally off second semiconductor device M14 having first and second main electrodes d and s coupling the normally off semiconductor device M14 between the insulated gate electrode G and one S of the first and second main electrode of the power first semiconductor device and a control electrode g coupled via a high impedance path R or R11 and R12 to the insulated gate electrode G of the power first semiconductor device 2 thereby causing the normally off semiconductor device M14 to be rendered conducting when a gate control signal is supplied to the insulation gate electrode G to enable conduction of the power first semiconductor device 2. The control arrangement also comprises disabling means 10 (including a normally off third semiconductor device M13) for inhibiting conduction of the normally off second semiconductor device during normal operation of the power semiconductor device 2.

A protected switch in accordance with the invention thus enables the use of a normally on device as the second semiconductor device to be avoided and moreover allows for there to be a negligible or virtually zero off-state current consumption in the protected switch.

As used herein the term "normally on" means a device having at least first and second main electrodes and a control electrode which is conducting when appropriate voltages are applied to the main electrodes but no voltage, (that is zero volts) is applied to the control electrode and which can only be turned off by actually applying a non-zero voltage to the control electrode. Generally, the normally on semiconductor device will be a depletion mode IGFET or a device derived from a depletion mode IGFET. However, any suitable normally on device such as a JFET or a device having both JFET and depletion mode IGFET characteristics may be used.

As used herein the term "normally off" is intended to mean a device having at least first and second main electrodes and a control electrode, which device is not rendered conducting when appropriate voltages are applied to the main electrodes until a non-zero voltage is also applied to the control electrode. Typically, the normally on device may be an enhancement mode IGFET or related device but it could also be a bipolar transistor or similar structure of the appropriate polarity.

FIG. 1 illustrates by way of a part block-schematic circuit diagram the principles of this protected switch in accordance with the invention.

As shown in FIG. 1, the power semiconductor device 2 comprises an n-channel enhancement mode power MOSFET 2 coupled as a high side switch for a load L. That is, the drain electrode D of the MOSFET 2 is coupled to a more positive first voltage supply line 3 and the source electrode S of the MOSFET 2 is coupled to the first terminal 4 while the load L is coupled between the first terminal 4 and a more negative second voltage supply line 6. Generally speaking, the second voltage supply line 6 will be connected to ground (earth) while the first voltage supply line 3 will be connected to a suitable positive potential, for example battery potential where the protected switch is intended for use in an automobile. The control or gate electrode G of the power MOSFET 2 is coupled to a gate drive circuit (not shown) via a gate input voltage terminal GT. The gate drive circuit may be of any suitable conventional form.

The normally off second semiconductor device comprises, in this example, an n channel low voltage enhancement mode insulated gate field effect transistor (IGFET) M14, although, of course, any other suitable form of normally off semiconductor device such as a bipolar transistor could be used to form the second semiconductor device. The control electrode g of the IGFET M14 is coupled to the gate electrode G of the power MOSFET 2 via a high impedance path provided in this example by a high value resistor R as shown in FIG. 1. The disabling means 10 may be of any suitable form which, in response to a signal TO for turning on the power MOSFET 2 provides a signal to the control electrode g of the enhancement mode IGFET M14 to disable the IGFET M14 and allow normal operation (that is conduction) of the power MOSFET 2 when appropriate voltages are supplied to the first and second voltage supply lines 3 and 6 and the gate terminal GT.

In such a high-side protected switch, the fact that there is no connection between the insulated gate electrode of the power first semiconductor device and the second voltage supply line should enable a high negative ring off without adversely affecting the power first semiconductor device.

Figure 2:
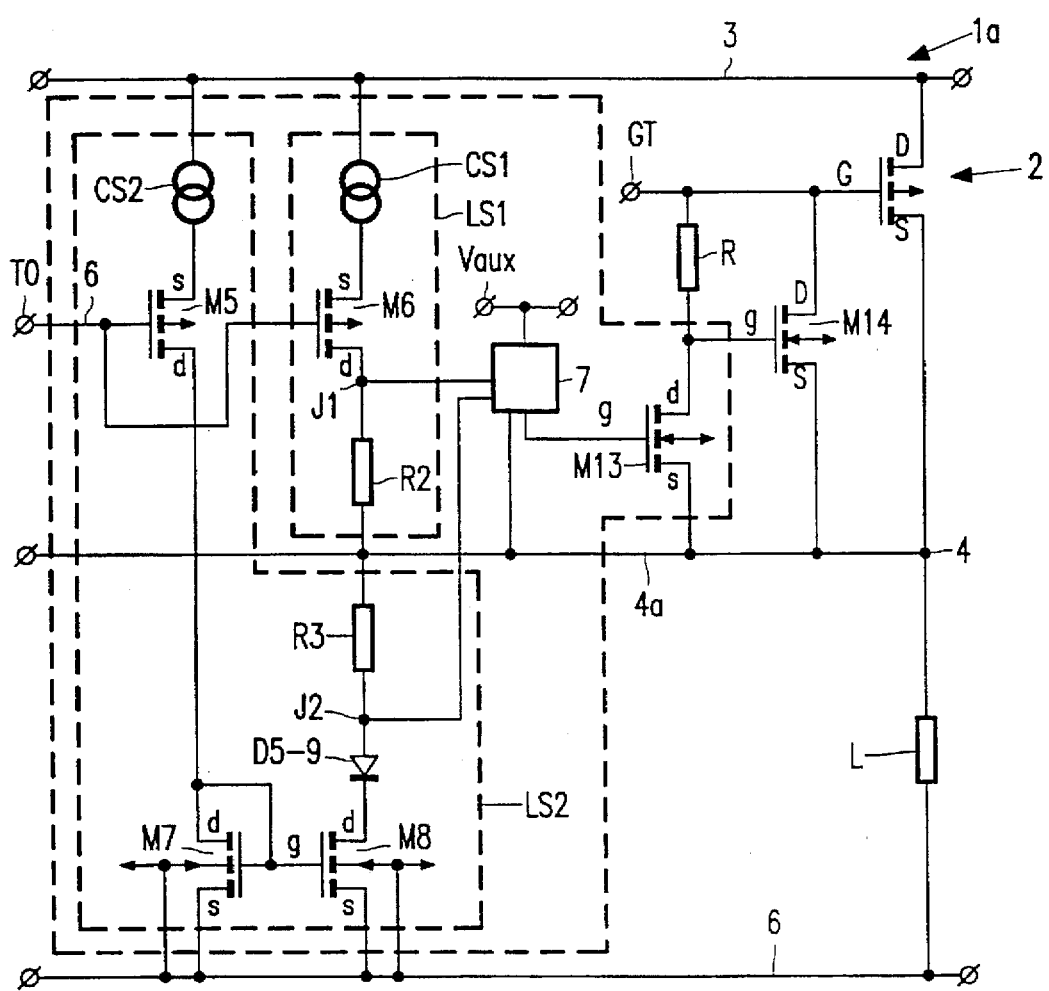
FIG. 2 is a more detailed part block schematic diagram of a protected switch in accordance with the invention.

As shown in FIG. 2, the disabling means 10 comprises a normally off third semiconductor device in the form of an n channel low voltage enhancement mode IGFET M13 having its first main electrode d coupled to the control electrode g of the IGFET M14 and its second main electrode s coupled to a load terminal connection line 4a connected to the first terminal 4 so that when the IGFET M13 is rendered conducting by the application of an appropriate voltage to its control electrode g, the voltage at the control electrode g of the IGFET M14 is reduced so rendering the IGFET M14 non-conducting and thus disabling the discharge path between the gate electrode G and the first terminal 4 to allow normal operation of the power MOSFET 2. The use of the enhancement mode IGFET M13 should have advantages in that such a device allows a very high impedance coupling between the insulated gate electrode G of the power first semiconductor device 2 and the control electrode of the IGFET M14 so that, when the IGFET M14 is disabled by the disabling means 10, only a very small current is withdrawn from the insulated gate electrode G of the power first semiconductor device 2 through the IGFET M13 so that the conduction or operation of the power first semiconductor device 2 is not significantly adversely affected by the operation of the disabling means 10.

FIG. 2 illustrates, again in very schematic part block diagrammatic form, a more detailed example of this high-side protected switch 1a in accordance with the invention. Thus, the remainder of the disabling means 10 may comprise first and second level shifting arrangements LS1 and LS2 to which the turn on signal TO is supplied.

In the example as shown in FIG. 2, the first level shifting arrangement LS1 comprises a first current source CS1 of any suitable form coupled in series with a switch M6 between the first voltage supply line 3 and a junction J1 coupled via a resistor R2 to the connection line 4a. The second level shifting arrangement LS2 comprises a second current source CS2, again of any suitable form, coupled between the first voltage supply line 3 and a switch M5. The switch M5 is coupled via a first path M7 of a current mirror arrangement to the second voltage supply line 6. A second path M8 of the current mirror arrangement is coupled via a diode D5-9 to a junction J2. The junction J2 is coupled to the connection line 4a via a resistor R3.

The switches M5 and M6 are both controlled by the turn on signal TO and, in this example, are in the form of high voltage p-channel enhancement mode IGFETs M5 and M6. In this example, the first path of the current mirror arrangement comprises a diode-connected high voltage n-channel enhancement mode IGFET M7 while the second path of the current mirror arrangement comprises a further high voltage n-channel enhancement mode IGFET M8 having its gate electrode coupled to the gate electrode of the IGFET M7. Of course, any suitable form of switches or current mirror arrangement may be used.

When the voltage at the first terminal 4 is less positive than the voltage of the first supply line 3 (which, in the case of a protected switch for use in an automobile, will be the battery potential), then the voltage at the junction J1 of the first level shifting arrangement LS1 acts to vary the conductance of a first conductive path whereas when the voltage at the first terminal 4 is greater than the potential of the second voltage supply line 6, generally ground, then the voltage of the junction J2 of the second level shifting arrangement LS2 acts to vary the conductance of a second conductive path. The first and second conductive paths are not shown in FIG. 2 but are included in the block referenced 7 which represents a comparator 7 operated between the connection line 4a and an auxiliary voltage supply line $V_{aux}$. The comparator 7 compares the voltages across respective corresponding portions of the first and second conductive paths and provides an output signal to render the IGFET M13 conducting to disable the IGFET M14 when a given relationship arises between the compared voltages.

Figure 3:
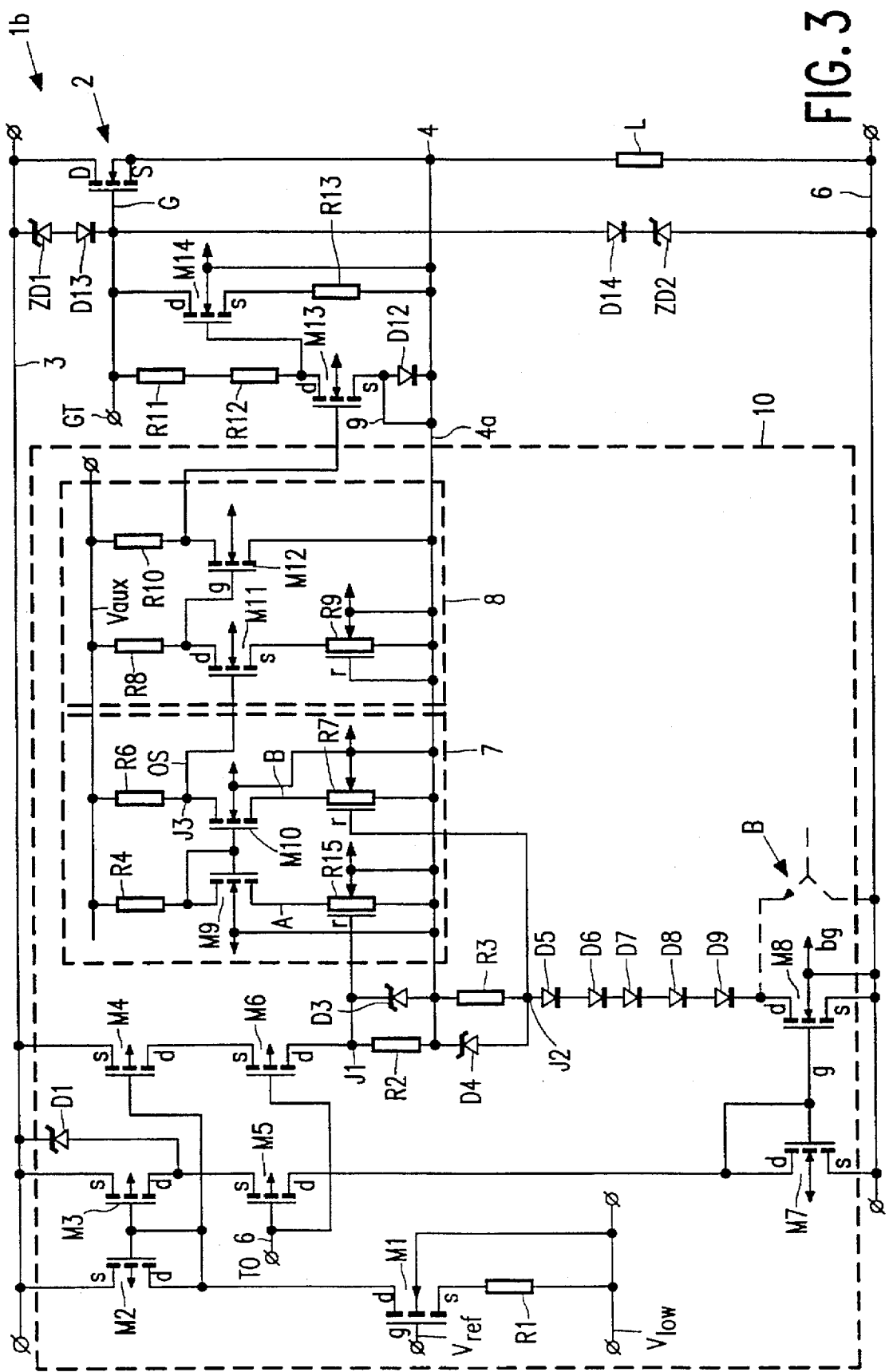
FIG. 3 shows a circuit diagram of one example of a protected switch in accordance with the invention.

FIG. 3 illustrates a detailed circuit diagram of one example of a high-side protected switch 1b in accordance with the invention. Again, the power semiconductor device comprises an n channel enhancement mode power MOSFET 2 coupled as a high side switch for a load L, that is with the more positive first main electrode D of the power MOSFET 2 coupled to the first voltage supply line 3 and the second main electrode S of the power MOSFET 2 coupled to the first terminal 4 which itself is coupled, in use of the protected switch, via the load L to the more negative second voltage supply line 6. The control or gate electrode G of the power MOSFET 2 is coupled to a gate drive circuit (not shown) of conventional structure via the gate control terminal GT.

A first voltage clamping arrangement is coupled between the first voltage supply line 3 and the insulated gate electrode G of the power MOSFET 2. In the example shown, the voltage clamping arrangement comprises a zener diode ZD1 oriented so as to be reverse-biased in normal operation of the power MOSFET 2. The zener diode ZD1 is arranged back-to-back with a diode D13 which will be forward-biased in normal operation of the power MOSFET 2 and serves to prevent current flow between the insulated gate electrode G and the first voltage supply line in the event that the zener diode ZD1 is forward-biased. A similar second clamping arrangement comprising a zener diode ZD2 arranged back-to-back with a diode D14 may be coupled between the insulated gate electrode G of the power MOSFET 2 and the second voltage supply line 6. Of course, although only zener diode ZD1, zener diode ZD2, and diodes D13 and D14 are shown, each of these diodes may be formed of as many diodes as is appropriate to achieve the desired breakdown characteristic. The diodes may be, for example, polycrystalline silicon diodes formed on an insulating layer over the power MOSFET 2.

The second semiconductor device again comprises an n-channel enhancement mode IGFET M14 coupled, in this example, in series with a resistor R13 between the gate electrode G and the first terminal 4. The control electrode g of the IGFET M14 is coupled via a high impedance resistance path provided in this example, by series-connected resistors R11 and R12 to the gate electrode G. The control electrode g of the IGFET M14 is again also coupled to the first main electrode d of the third semiconductor device which is, again, in the form of an n-channel enhancement mode IGFET M13. As shown in FIG. 3, if desired, a threshold-adjusting diode D12 may be coupled between the second main electrode s of the IGFET M13 and the load terminal connection line 4a with its anode coupled to the second main electrode s of the IGFET M13 by breaking a shorting link 9 provided in parallel with the diode D12.

The disabling means 10 shown in FIG. 3 will now be described in detail. As shown in FIG. 3, an n-channel low voltage enhancement mode IGFET M1 has its control or gate electrode g coupled to a reference voltage supply terminal $V_{ref}$ and one of its first and second main electrodes s coupled via a resistor R1 to a low voltage supply terminal $V_{low}$. The other main electrode d of the IGFET M1 is coupled via the source-drain conduction path of a low voltage p-channel enhancement mode IGFET M2 to the first voltage supply line 3. The IGFET M2 is diode-connected and its gate or control electrode g is also coupled to the gate or control electrodes of further low voltage p-channel enhancement mode IGFETs M3 and M4 each having their source electrodes s coupled to the first voltage supply line 3. The drain electrodes of IGFET M3 and M4 are coupled to the source electrodes of switching transistors in the form of high voltage p-channel enhancement mode IGFETs M5 and M6 respectively.

The signal TO is supplied to a terminal 6 coupled to the gates of the high voltage p-channel enhancement mode IGFETs M5 and M6. As in the example shown in FIG. 2, the drain electrode d of IGFET M5 is coupled to the drain electrode d of diode-connected high voltage n-channel enhancement mode IGFET M7 which forms a current mirror arrangement with a further high voltage n-channel enhancement mode IGFET M8, both of the IGFETs M7 and M8 having their source electrodes s coupled to the second voltage supply line 6. The drain electrode d of IGFET M6 is coupled in series with a resistor R2 to the connection line 4a.

The drain electrode of the IGFET M8 is coupled to the cathode of a first diode D9 of a chain of, in this example, five diodes D9 to D5. It will, of course, be appreciated that the number of diodes provided will depend upon the particular requirements of the circuit and the characteristics of the particular diode. The anode of the last diode D5 of the chain is coupled to the connection line 4a via a resistor R3 connected in parallel with a zener diode D4.

The first level shifter LS1 is effectively formed by the IGFETs M1, M2, M4 and M6, the resistor R2 and the diode D4 while the second level shifter LS2 is effectively formed by the IGFETs M1, M2, M3, M5, M7, M8, diodes D9 to D5 and resistor R3. The resistor R1 and IGFETs M1, M2 and M4 effectively form the current source CS1 of the level shifter LS1 while the resistor R1 and IGFETs M1, M2 and M3 effectively form the current source CS2 of the level shifter LS2.

As indicated with respect to FIG. 2, the level shifters LS1 and LS2 act to control the voltages at the respective junctions J1 and J2. The junctions J1 and J2 are coupled to the respective control electrodes r of first and second auxiliary semiconductor devices R5 and R7 which act as voltage-controlled resistors. Any suitable form of normally on device may be used for the first and second auxiliary semiconductor devices. In this particular example, the first and second auxiliary semiconductor devices R5 and R7 are in the form of n-channel depletion mode IGFETs, i.e they are gate-controlled resistors.

This use of first and second levels shifters LS1 and LS2 to modify the conductance of first and second conductive paths in the control arrangement of a power semiconductor device is itself an innovation. Thus, FIG. 3 illustrates a novel protected switch 1b comprising a power first semiconductor device 2 having a first main electrode D for coupling to a first voltage supply line 3, a second main electrode S coupled to a first terminal 4 for connection via a load L to a second voltage supply line 6, and an insulated gate electrode G coupled to a control terminal GT for supplying a gate control signal to enable conduction of the power semiconductor device 2. The control arrangement included in this switch 1b for controlling operation of the power semiconductor device 2 comprises a second semiconductor device M14 for coupling the insulated gate electrode G of the power semiconductor device 2 and the first terminal 4, and means for inhibiting this coupling of the insulated gate electrode G and the second main electrode S of the power semiconductor device 2. The inhibiting means comprises respective first and second conductive paths, each including a voltage-controlled resistor R5 and R7 respectively whereby voltages at J1 and J2 of the level shifters LS1 and LS2 can modify the conductance of these first and second paths. The conductance of at least a part (R5) of the first path is modified in this way when the voltage at the first terminal 4 is less than the voltage at the more positive one (3) of the first and second voltage supply lines. The conductance of at least a part (R7) of the second path is modified when the voltage at the first terminal 4 is greater than the voltage at the other less positive one (6) of the first and second voltage supply lines. By comparing the voltages at respective corresponding locations on these first and second paths in the comparator 7, an output signal is provided (via lines OS and 80) to inhibit the coupling of the insulated gate electrode G and the second main electrode S of the power semiconductor device 2 by the second semiconductor device M14 when a predetermined relationship between the voltages at the respective corresponding locations is detected.

Such a protective switch 1b can operate correctly even when the battery potential applied between the first and second supply lines 3 and 6 is in a low state. Thus, the gate voltage swings necessary to cause a detectable change in the resistance of the voltage controlled resistor R5 or R7 in the conductive path A or B with the level shifters LS1 and LS2 may be very small, and much smaller than for example the voltage swings which would be required to reach the threshold of an IGFET. This minimises the voltage headroom required between the load terminal and the respective supply line for each half of the level shifter.

A zener diode D3 may be coupled in parallel with the resistor R2 to protect the gate oxide of the second auxiliary semiconductor device R5.

As illustrated in the example of FIG. 3, the first and second auxiliary semiconductor devices R5 and R7 are provided in respective arms A and B of a differential amplifier forming the comparator 7.

Although, of course, any suitable form of comparator may be used, in the example shown in FIG. 3 the first arm A of the comparator in this example comprises a resistor R4 coupled in series with a diode-connected n-channel low voltage enhancement mode IGFET M9 between the auxiliary voltage supply line $V_{aux}$ and the first semiconductor device R5, while the other arm B of the bridge 7 comprises a resistor R6 coupled in series with an n-channel low voltage enhancement mode IGFET M10 between the auxiliary voltage supply line $V_{aux}$ and the second semiconductor device R7. The gate of the IGFET M10 is coupled to the gate of the IGFET M9. The output OS of the differential amplifier or bridge circuit 7 is taken at junction J3 between the resistor R6 and the drain electrode of the IGFET M10.

The output OS of the differential amplifier 7 is coupled to a gain stage 8 which, in this example, comprises two inverter stages. Thus, as shown in FIG. 3, the gain stage 8 comprises an n-channel low voltage enhancement mode IGFET M11 having its drain electrode d coupled via a resistor R8 to the auxiliary voltage supply line $V_{aux}$ and its source electrode s coupled via a resistor R9 to the connection line 4a. As shown the resistor R9 is in the form of an n-channel depletion mode IGFET similar to the first and second semiconductor devices R5 and R7 to match the threshold of the stage formed by IGFET M11 and resistors R8 and R9 to the operating point of the preceding differential stage. The drain electrode d of the IGFET M11 is coupled to the insulated gate electrode of an n-channel low voltage enhancement mode IGFET M12 of the second inverter stage. IGFET M12 has its drain electrode connected via a resistor R10 to the auxiliary voltage supply line $V_{aux}$ and its source electrode coupled to the connection line 4a. The amplified output signal is supplied via line 80 to the gate or control electrode g of the n-channel low voltage enhancement mode IGFET M13.

As indicated above, a diode D12 may be coupled in series with the IGFET M13 forming the third semiconductor device by breaking the conductive link 9 so as to increase the threshold voltage of the IGFET M13 to ensure that the threshold voltage of the IGFET M13 is higher than that of the IGFET M12 so that, if during turn-off the voltage on the auxiliary voltage supply line $V_{aux}$ collapses below the operating headroom of the comparator 7 and then rises due to interaction of the load L, IGFET M12 will turn on first preventing IGFET 13 turning on which would otherwise disable the gate discharge IGFET M14. Of course, other methods for ensuring that IGFET M12 will turn on before IGFET M13 may be used. Thus, for example, appropriate resistance values for the loads of IGFETs M12 and M13 may be used, their relative conduction channel lengths and/or widths may be adjusted (for example by giving the IGFET M12 a wide conduction channel and the IGFET M13 a narrow conduction channel) or, of course, the gate insulating layer thickness or dielectric may be adjusted to achieve the desired threshold voltage.

As will be appreciated, each of the enhancement mode IGFETs M1 to M14 and the depletion mode gate-controlled resistors R5, R7 and R9 have a back gate electrode bg. These back gate electrodes are coupled to the most appropriate points within the circuit to avoid undesired parasitic bipolar action. Thus, the back gates bg of n-channel low voltage enhancement mode IGFETs M9, M10 M11, M12, M13 and M14 and the back gates bg of the n-channel depletion mode gate-controlled resistors R5, R7, and R9 are coupled to the connection line 4a. The back gates bg of the high voltage n-channel enhancement mode IGFETs M7 and M8 are connected to the second voltage supply line 6. The back gates of p-channel enhancement mode IGFETS M2, M3, M4, M5 and M6 are connected to voltage supply line 3. The back gate of IGFET M1 is shown as connected to the low voltage supply terminal $V_{low}$.

The remaining resistors may have any suitable construction. In the example shown in FIG. 3, resistors R2, R13 and especially R3 are formed as thin film resistors to inhibit unnecessary parasitic action while the resistors R1, R4, R6, R8 and R10 to R12 are formed as diffused resistors.

The various diodes may all be formed as thin film constructions so as, again, to avoid undesired parasitic bipolar action. Generally, the various IGFETs will be formed as diffused devices although it may, of course, be possible again to form these as thin film devices.

The values of the various components forming the protected switch 1b will, of course, depend upon the precise nature of the components used and the particular requirements for the protected switch. However, to take an example, the resistors R2 and R3 which effectively form the loads of the level shifters LS2 and LS1 should be small so that the time constants of the level shifters LS1 and LS2 are small to provide a rapid response and good immunity to changes with time of voltage (dV/dt) injecting charge via stray capacitance. Generally, resistors R4, R6 and R8 will be of equal value and approximately equal to the value of the resistor R10 while the preset value of resistor R5 will be equal to that of resistor R9 multiplied by K and the preset value of R7 will be equal to the value of resistor R9 divided by K where K is a selected constant, for example 1.05. The different preset or nominal values of the gate-controlled resistors R5 and R7 provide a built-in imbalance for the bridge 7. Of course, this imbalance could be achieved by varying other component values, for example by giving the resistors R4 and R6 different values. The IGFETs M7 and M8 may be matched, that is may have the same channel width and length, or may have their channel widths and lengths in a predetermined fixed ratio other than 1. Similarly, the IGFETs M2, M3 and M4 may be matched or have their channel lengths and widths in a predetermined fixed ratio other than 1. The IGFET M14 should have a wide conduction channel to allow rapid discharge of the gate capacitance of the power MOSFET 2.

Although it would, of course, be possible to form the circuit of discrete components, in this example, the various components of the circuit shown in FIG. 3 are integrated in the same semiconductor body as the power MOSFET 2.

FIGS. 4 to 8 illustrate by way of cross-sectional views of different parts of a semiconductor body 100 how components which may be used in the circuit shown in FIG. 3 may be formed.

The semiconductor body 100 comprises, in this example, a relatively highly doped n conductivity type single crystal silicon substrate 100a on which is provided a relatively lowly doped n conductivity type silicon epitaxial layer 100b which forms the drain drift region of the MOSFET 2.

Figure 4:
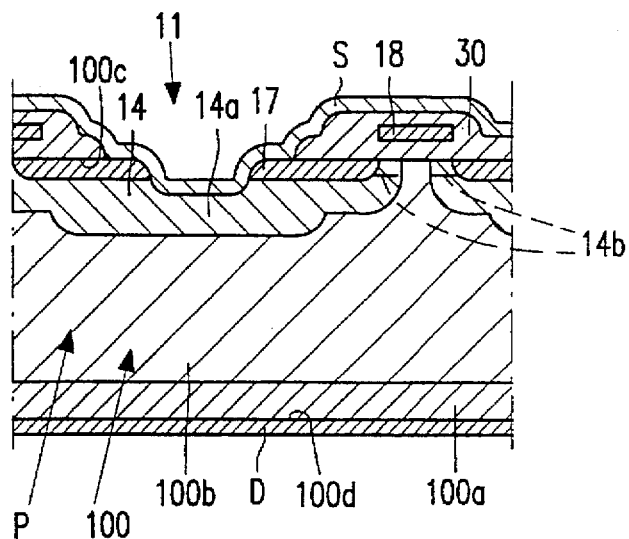
FIGS. 4 to 8 are cross-sectional views of various parts of a semiconductor body for illustrating a cell of a power semiconductor device and components suitable for use in a protected switch in accordance with the invention.

The n-channel enhancement mode power MOSFET 2 is formed using conventional DMOS processing technology. One source cell 11 of the MOSFET 2 is shown in FIG. 4. The source cell 11 comprises, adjacent one major surface 100c of the semiconductor body 100, a p conductivity type body region 14 which contains an n conductivity type source region 17 and defines therewith a conduction channel area 14b under the insulated gate (shown as 18 in FIG. 4) of the power MOSFET 2. As shown, the p body region 14 may have a central relatively highly doped subsidiary region 14a which is shorted (either as shown by a moat etched through the source region 17 or by masking the source implant) to the source electrode S of the power MOSFET 2 to inhibit parasitic bipolar action. The source and gate (not shown) electrodes S and G are formed by metallisation provided on top of an insulating layer 30 and making contact to the source region 17 and insulated gate 18, respectively, via appropriate contact holes. The drain electrode D is provided on the other major surface 100d of the semiconductor body 100.

Figure 5:
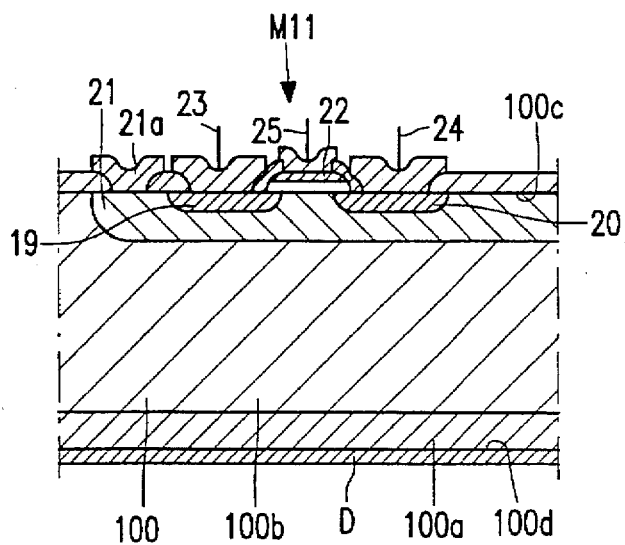

FIG. 5 shows an example of a possible structure for a lateral low voltage enhancement mode NMOS IGFET which may be used to form the IGFETs M1 and M9 to M14 of the circuit shown in FIG. 3. By way of example, FIG. 5 is referenced as being the IGFET M11. As shown in FIG. 5 the IGFET has n conductivity type source and drain regions 19 and 20 diffused in a p conductivity type second region which may, as will be explained below, form an isolation or well region 21. Where it is necessary for the IGFET to withstand high voltages then any suitable conventional form of field relief may be provided and the regions 19 and 20 may be provided with lowly doped extension regions. An insulated gate 22 and source, gate and drain electrodes, 23, 24 and 25 are formed on the insulating layer 30. In this example, a further electrode 21a is shown as coupled to the isolation or well region 21 to enable the back gate of the IGFET to be coupled to the appropriate connection, that is, in the case of IGFET M11, to the connection line 4a.

Figure 6:
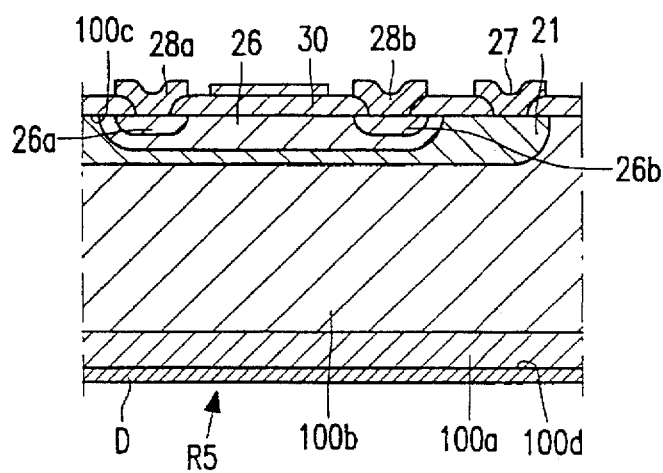

FIG. 6 shows an example of one of the gate-controlled, that is voltage-controlled, resistors R5, R7 and R9 which are formed as, effectively, depletion mode NMOS transistors. Thus, as shown, the resistor R5 comprises a relatively lowly doped n conductivity type region 26 formed within a p conductivity type region which, because the back gates of the resistors R5, R7 and R9 are coupled to the same point as the back gate of the IGFET M11, may be part of the isolation or well region 21. Of course, where the back gates of IGFETs are coupled to other points within the circuit, then separate isolation wells will be required although, for convenience, all the IGFETs having their back gates connected to the same point may be formed within the same p conductivity type isolation well. Respective source and drain electrodes 28a and 28b contact relatively highly doped n conductivity type regions 26a and 26b spaced apart within the relatively lowly doped n conductivity type region 26 while a conductive, generally doped polycrystalline silicon, layer is provided over the n conductivity type region 26 on top of the insulating layer 30 which is formed from part of the thermal oxide layer deposited to provide the gate oxide of the IGFETs. The polycrystalline layer forms the control electrode r of the gate controlled resistor. An electrode 27 may be provided to couple the well region 21 to the appropriate reference potential (in this case the connection line 4a), although, of course, this may not be necessary where the resistor R5 is formed in the same p conductivity type well region 21 as other components one or more of which provides an electrode contacting the isolation well and coupling it to the connection line 4a.

The diffused resistors R1, R4, R6, R8 and R10 to R12 may have a similar construction to that shown in FIG. 6 but without gate oxide or the control electrode r. Where desired, an electrostatic screen may be provided over a passivating insulating layer provided over the resistor, however.

Figure 7:
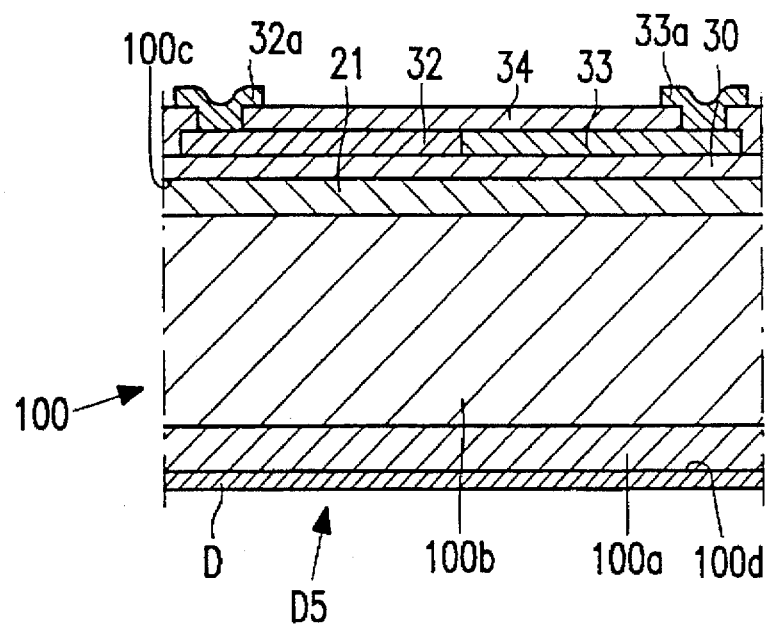
Figure 8:
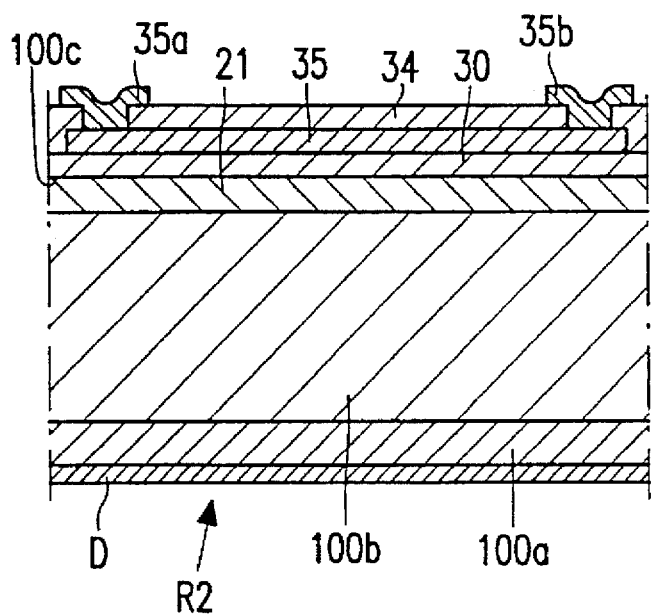

FIG. 7 shows an example of a thin film diode structure, for example one of diodes D5 to D9 in FIG. 1, while FIG. 8 shows an example of a thin film resistor, for example one of resistors R2, R3 and R13 in FIG. 3. As shown, the diode D5 is a pn junction diode consisting of oppositely doped regions 32 and 33 of polycrystalline silicon with respective electrodes 32a and 33a making contact through openings in an insulating layer 34 provided over the doped polycrystalline silicon layer while the resistor R2 is generally formed by an n conductivity type doped polycrystalline silicon region 35 with respective spaced electrodes 35a and 35b making contact to the n conductivity type doped polycrystalline silicon region 35 through openings in the insulating layer 34.

In operation of the circuit shown in FIG. 3, when appropriate voltages are applied to the first and second voltage supply lines 3 and 6, a signal is applied to the gate terminal GT to turn on the power MOSFET 2, the logic turn on signal TO is also applied to the terminal 6. The logic signal TO is independent of both the auxiliary voltage supply line $V_{aux}$ and the connection line 4a.

The two level shifters LS1 and LS2 are used to reference the logic signal TO to the connection line 4a. The level shift current is generated from a reference voltage supplied to the reference terminal $V_{ref}$.

The level shifters LS1 and LS2 act to enable the IGFET M14 to be disabled even when the voltage at the first terminal 4 is close to the potential of either the first of second voltage supply lines 3 and 6.

Thus, when the voltage at the first terminal 4 of the load L is less than the potential of the more positive first voltage supply line 3 (for example the voltage supplied by a battery where the load is, for example, a lamp or other component of an automobile electrical system), then the IGFET M4 sources current via the switching IGFET M6 to the resistor R2. The voltage across the resistor R2 is fed to the gate electrode r of the gate-controlled resistor R5 so as to vary its conductance. The diode D3 acts to protect the gate oxide of the resistor R5 from damage during externally applied high rates of charge of voltage dV/dt which could capacitively apply large voltages to the control electrode r of the auxiliary semiconductor device R5.

In the alternative, when the voltage at the first terminal 4 of the load L is greater than the voltage of the less positive second voltage supply line 3, generally ground, then the IGFET M3 sources current via the switching IGFET M5 to the IGFET M7. The current through the IGFET M7 is mirrored by the IGFET M8 to the resistor R3. The voltage across the resistor R3 is fed via the junction J2 to the gate electrode r of the other gate-controlled resistor R7 so as to vary its conductance. In this case, diode D4 acts to protect the gate oxide of the gate-controlled resistor R7. Diodes D5 to D9 act to prevent or at least inhibit parasitic conduction in the IGFET M8 when the first terminal 4 of the load L is at a potential below that of the second voltage supply line 6 as may occur, for example, with inductive loads.

Thus, the level shifters LS1 and LS2 cause via the junctions J1 and J2, a change in the conductance of the associated voltage controlled resistors R5 and R7 from their preset values when the voltage at the first terminal 4 of the load is less than the potential of the first voltage supply line 3 and greater than the potential of the second voltage supply line 6, respectively. In either case, the resulting change in conductance effectively opposes or cancels the built-in imbalance in the differential amplifier or bridge 7 provided by the difference in the preset or initial values of the resistors R5 and R7. This opposing or cancelling of the built-in imbalance causes the differential amplifier or bridge 7 to supply a high output signal at output OS to the control electrode g of the IGFET M11 of the first inverter of the gain stage 8. This causes the IGFET M11 to conduct so lowering the voltage at its drain electrode d and thus rendering the IGFET M12 non-conducting so raising the voltage at its drain electrode and thereby causing the IGFET M13 to conduct to lower the voltage at the control electrode g of the IGFET M14 thereby disabling the gate discharge circuit to allow the power MOSFET 2 to conduct in accordance with the control signal applied to its gate electrode G. Accordingly, the disabling arrangement 10 allows the power MOSFET 2 to be turned on by disabling the IGFET M14 which would otherwise be conducting. When the gate voltage is removed from the gate terminal GT, the turn on signal TO will also be removed so that the disabling arrangement 10 is not able to function to turn on the IGFET M13. Accordingly, because of the coupling of its control electrode g to the gate electrode G of the power MOSFET 2, the IGFET M14 becomes conducting to discharge the gate capacitance of the power MOSFET 2 through the load L so as to ensure rapid switching off of the power MOSFET 2 when the turn on signal TO is not present.

A protected switch 1, 1a or 1b allows for a high negative ring off of an inductive load L without any, or at least without any significant, adverse effect on the power MOSFET 2 because of the lack of a conductive path or connection between the insulated gate electrode G of the power MOSFET 2 and the second voltage supply line 6. This lack of a conductive path allows the voltages at the insulated gate electrode G and second main electrode of the power MOSFET 2 to swing, under the bias of a recirculating inductive load L, together below the voltage of the second voltage supply line 6 (generally ground in the examples given above) without adversely affecting the power MOSFET 2. In the protected switches 1a and 1b shown in FIGS. 2 and 3, the diode D5-9 or diode chain D5 to D9 acts to prevent conduction of the IGFET M8 and its inherent parasitic bipolar transistor (shown in phantom lines in FIG. 3) under negative ring off conditions if the voltage at the insulated gate electrode G and second main electrode of the power MOSFET 2 do not go too far below the voltage of the second voltage supply line 6, generally ground. The magnitude of the negative ring off, that is the magnitude of the voltage between the insulated gate G and second main electrodes of the power MOSFET 2 and the second voltage supply line 6 is, in the protected switch 1b shown in FIG. 3, limited by the voltage clamping arrangements ZD1, D13 and ZD2, D14 or the rugged avalanche of the power MOSFET 2 so as to avoid or at least reduce the possibility of any damage to the power MOSFET 2. The voltage clamping arrangement ZD2 between the insulated gate electrode G and the second voltage supply line 6 restricts the negative ring off to the avalanche breakdown of the voltage clamping arrangement ZD3, typically 15 volts. It is possible that the diode chain D5 to D9 may avalanche if the voltage at the terminal connection line 4a becomes sufficiently negative with respect to the voltage of the second voltage supply line 6. Under such conditions, the parasitic bipolar inherent in the IGFET M8 may turn on. Although not shown in FIG. 3, a resistance of 5 to 10 Kilo-Ohm may be placed in series with the diode chain D5 to D9 to act as a current limiter, so allowing the parasitic bipolar transistor of the IGFET M8 to turn on without experiencing irreversible breakdown where the back gate of the IGFET M8 is not a long way below the voltage of the first voltage supply line 3 because the parasitic bipolar transistor will typically only be fragile, that is liable to irreversible breakdown, when its collector-base voltage is around 30 volts. Of course, if both the connection line 4a and the second voltage supply line 6 are negative, the diode chain D5 to D9 will not conduct. In such circumstances, the voltage clamping arrangement ZD2 acts to clamp the voltage between the insulated gate electrode G and the second voltage supply line 6 to the breakdown voltage of the voltage clamping arrangements.

Figure 9A:
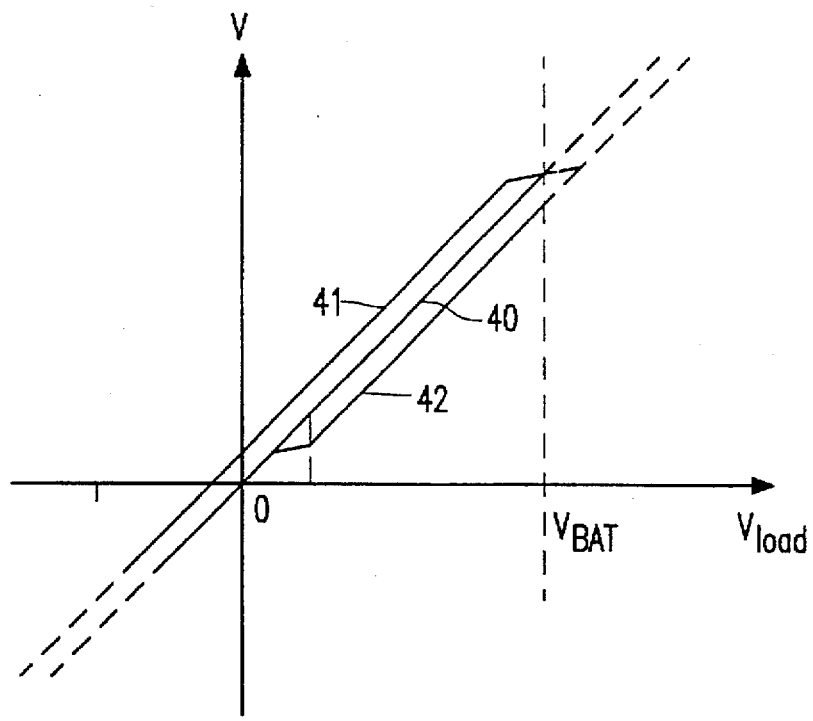
FIGS. 9a and 9b are graphs for illustrating the operation of the protected switch shown in Figure.

As indicated above, the disabling means 10 acts to disable the IGFET M14. This can perhaps be explained more clearly by reference to FIGS. 9a and 9b. FIG. 9a shows a graph of voltage in volts (V) against the voltage $V_{load}$ at the terminal 4 or the load terminal connection line 4a vertical dash line A represents the voltage of the first voltage supply line 3 which in the examples given above is positive with respect to the second voltage supply line 6 which is generally at ground. Where the protected switch is powered from a battery such as an automotive battery then the voltage at the first voltage supply line 6 will typically be 12 volts.

The straight line 40 in FIG. 9a indicates the voltage at the connection line 4a. Where, as in the examples described above, the load L is an inductive load, then the voltage at the first terminal 4 or the connection line 4a may, of course, drop below that of the second voltage supply line 6. The dashed regions of the line 40 indicate the remote possibility of the voltage at the first terminal 4 being greater than that of the voltage at the first voltage supply line 3 or going below the voltage as the second voltage supply line 6 by greater than a normally expected amount, typically minus 20 volts where the second voltage supply line 6 is at ground (zero voltages). The line 41 in FIG. 9a indicates the voltage at the junction J1 while the line 42 indicates the voltage at the junction J2.

As can be seen from FIG. 9a where the voltage at the first terminal 4 or the connection line 4a is at or very close to the voltage at the second supply line 6 (ground in the examples given above) then the diode chain D5 to D9 acts in such a way that the voltage at the junction J2 is pulled by the resistor R3 towards the voltage of the connection line 4a so that, as shown in FIG. 9a, the voltage at the junction J2 is effectively the same as the voltage at the first terminal 4 or the connection line 4a so there can be no variation of the conductance of the gate controlled resistor R7. If, however, the voltage at the first terminal 4 or the connection line 4a is a few millivolts above the voltage of the second voltage supply line 6, then the diode chain D5 to D9 will act to pull down the voltage at the junction J2 so that the voltage at the junction J2 is, typically, 0.5 to 1 volt below the voltage at the first terminal 4 or the connection line 4a so that the second level shifter LS2 acts to vary the conductance of the gate controlled resistor R7. As can be seen from the line 41 in FIG. 9a, the voltage at the junction J2 will be greater (again typically by 0.5 to 1 volts) than that at the first terminal 4 or the connection line 4a until the voltage at the first terminal 4 or the connection line 4a reaches or gets close (typically within a few millivolts) to the voltage of the first supply line 3 and there is no longer be any voltage head room to allow for the turn on voltage of the IGFET M6. Accordingly, until the voltage at the first terminal 4 or the connection line 4a reaches or gets close to the voltage of the first voltage supply line 3, the voltage at the junction J1 will be somewhat higher than the voltage at the first terminal or the connection line 4a so enabling the first level shifter LS1 to cause a variation in the conductance of the gate controlled resistor R5. Although as indicated by FIG. 9a, the conductances of both gate controlled resistors R5 and R7 may be varied at the same time (in opposite directions), generally a variation in the conductance of either the gate controlled resistor R5 or the gate controlled resistor R7 will be sufficient to counteract the imbalance in the comparator or bridge 7 and so provide, via the gain stage 8 if present, a signal to render the IGFET M13 conducting so as to disable the IGFET M14.

Figure 9B:
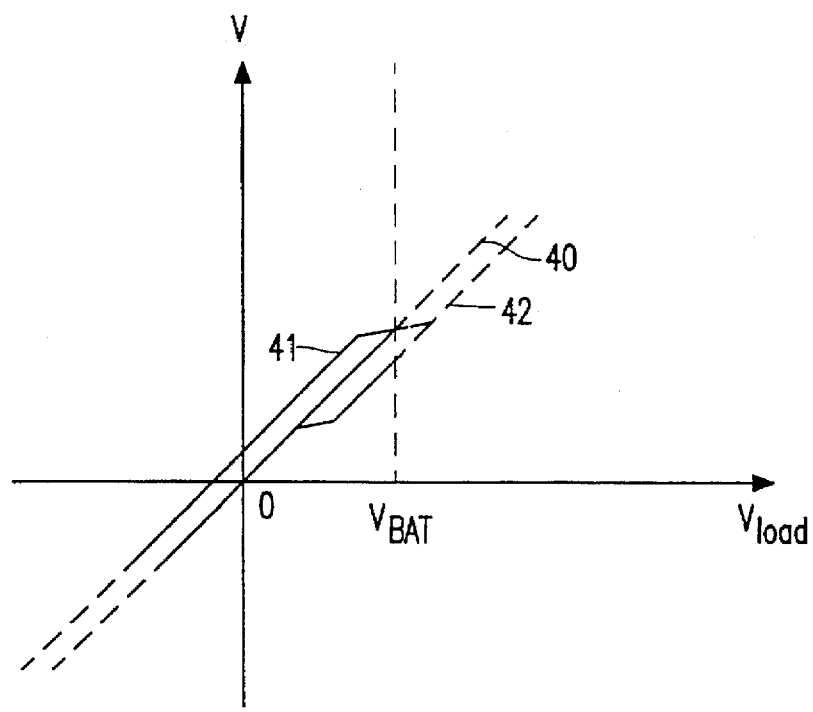

As will be appreciated from the discussion above with reference to FIG. 9a, the voltage difference between the junctions J1 and J2 and the first terminal 4 or connection line 4a is small so that there will be some kind of swing even when the voltage at the first voltage supply line 3 is low. FIG. 9b illustrates this by showing the situation where the voltage at the first supply line 3 is 5 volts which indicates the case of a very low battery voltage. Thus, keeping the swing of voltage at the junctions J1 and J2 necessary to vary the conductance of the respective gate controlled resistors R5 and R7 sufficiently to enable the IGFET M14 to be disabled small and keeping the voltage drop across the diode chain D5 to D9 small means that even when the battery voltage is very low, below 5 volts, there will only be a very small region in which neither of the junctions J1 and J2 have a voltage different from that of the first terminal 4. Accordingly, the disabling means turn should be operative over the normal range of voltages which can be expected at the first terminal 4 during switching of an inductive load L.

Should inherent parasitic bipolar transistors present problems if the voltage at the connection line 4a exceeds the voltage on the first voltage supply line 3, then the first terminal 4 may be coupled to the connection line 4a via appropriate active and/or passive components to ensure that the voltage on the connection line 4a stays below the voltage of the first voltage supply line 3 even if the voltage at the first terminal 4 exceeds the first supply line voltage 3. Also, a diode may be coupled in series with the current path to junction J1, that is between junction J1 and M6 with its cathode coupled to junction J1, to avoid the voltage at junction J1 being pulled below the voltage at the connection line 4a if the voltage of the connection line 4a goes above battery.

It should, of course, be appreciated that the threshold voltage of IGFET M13 is arranged to be higher than that of IGFET M12 so that, if during turn off of the power MOSFET 2 the voltage on the auxiliary voltage supply line $V_{aux}$ drops below the required operating headroom of the bridge 7 and then rises due to load interaction, IGFET M12 will turn on first so inhibiting turn on of IGFET M13 which would otherwise act to disable the gate discharge by switching off IGFET M14. The threshold voltage of the IGFET M13 may, as indicated above, be adjusted by breaking the link 9 so as to remove the short circuit around the diode D1, by using appropriate resistance values for the loads of IGFETs M12 and M13, for example by adjusting their relative conduction channel lengths and/or widths (for example by giving the IGFET M12 a wide conduction channel and the IGFET M13 a narrow conduction channel) or, of course, by adjusting the gate insulating layer thickness or dielectric to achieve the desired threshold voltage.

Although in the example described above, the power MOSFET 2 has been shown as a high side switch, that is coupled between the positive voltage supply line 3 and the load L, the present invention could be applied to a low side switch with the power MOSFET coupled between the more negative (i.e less positive) voltage supply line and the load L, with appropriate modification of the circuitry.

Figure 10:
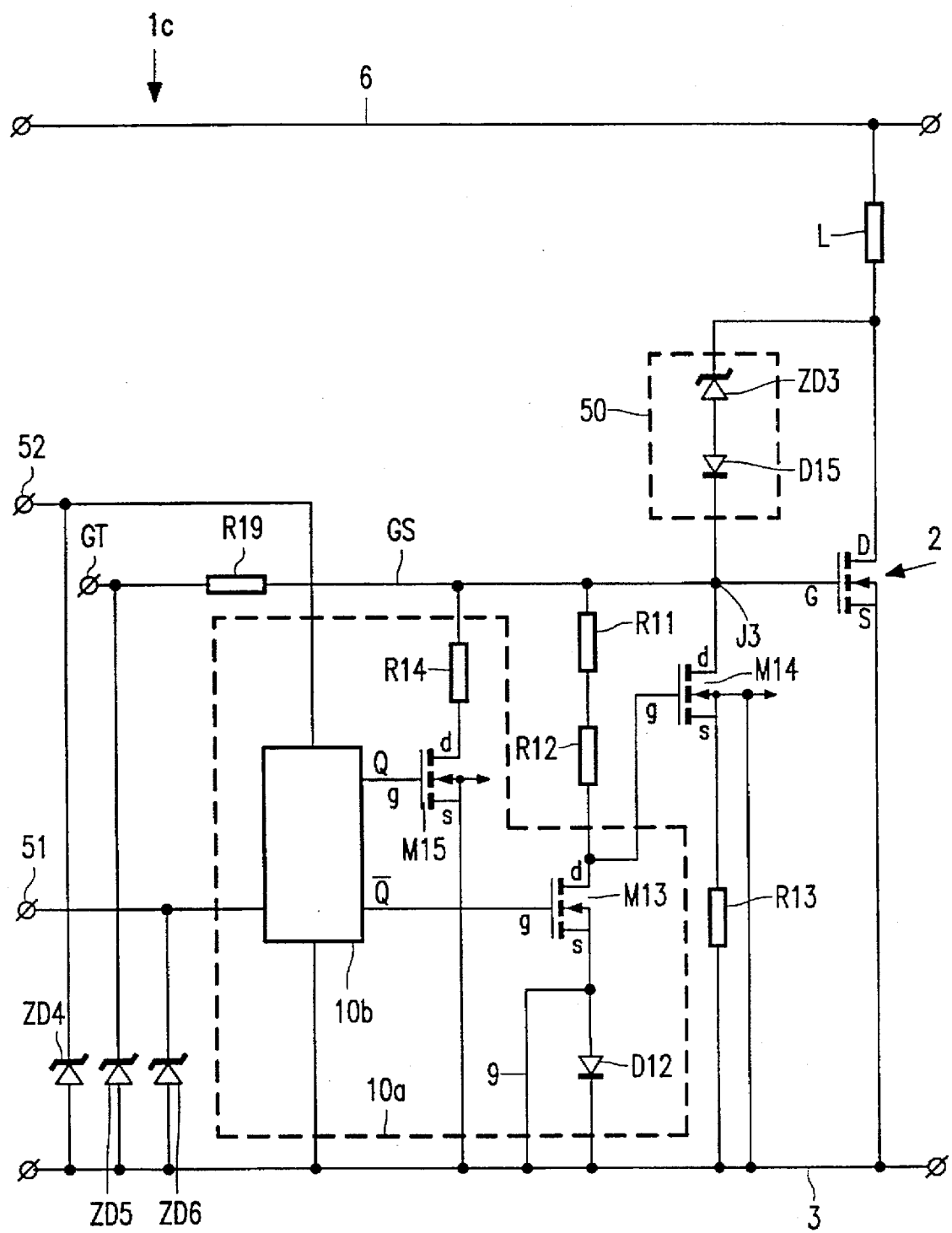
FIG. 10 shows a simplified, part block schematic, circuit diagram of another example of a protected switch in accordance with the invention.

FIG. 10 shows another example of a protected switch 1c in accordance with the invention. In this case, the protected switch comprises a low-side protected switch, that is the first voltage supply line 3 is the more negative or less positive of the first and second voltage supply line and is generally connected to earth (ground) while the second voltage supply line 6 is the more positive of the first and second voltage supply lines and is connected to a suitable positive potential, for example, battery potential where the protected switch is intended for use in an automobile.

As shown in FIG. 10, the power first semiconductor device again comprises an n-channel enhancement mode power MOSFET 2 and accordingly the first main electrode coupled to the first voltage supply line 3 will be the source electrode S of the power MOSFET 2 while the second main electrode coupled to the first terminal 4 will be the drain electrode D of the power MOSFET 2. A voltage clamping arrangement 50 is coupled between the drain and insulated gate electrodes D and G of the power MOSFET 2. Any suitable form of clamping arrangement may be used, for example a clamping arrangement comprising a zener diode ZD3 and a diode D15 similar to the combination shown in FIG. 3 or a voltage clamping arrangement similar to that described in European Patent Application Publication 0523800.

As in the examples shown in FIGS. 1 to 3, the enhancement mode nchannel IGFET M14 is coupled in series with a resistor R13 between the insulated gate electrode G and source electrode S of the power MOSFET 2. The control electrode g of the IGFET M14 is coupled to the gate electrode G of the power MOSFET 2 via a high impedance path provided by the resistors R11 and R12. Again any suitable form of disabling means 10a may be used which provides a signal to the control electrode g of the IGFET M14 to disable the IGFET M14 and allow normal operation (that is conduction) of the power MOSFET 2 when appropriate voltages are applied to the first and second voltage supply lines 3 and 6 and the gate terminal g to which the insulated gate electrode G is coupled via a resistance $R_{ig}$.

In the example shown in FIG. 10, the disabling means 10a again comprises the enhancement mode IGFET M13 having one main electrode s coupled to the control electrode G of the IGFET M14. In this case, the other d main electrode S of the IGFET M13 is coupled to the first voltage supply line 3 (that is earth in this example). As in the example shown in FIG. 3, if desired, the threshold-adjusting diode D12 may be provided.

In this example, the control gate of the IGFET M13 is coupled to the one output $\overline{Q}$ of logic circuitry 10b which provides a high signal to render the IGFET M13 conducting whenever an input signal on input line 51 to the logic circuitry 10a indicates that the power MOSFET 2 is to be conducting and that no fault has been detected. The logic circuitry 10b may be of any suitable conventional form and is, as shown in FIG. 10, powered between a separate logic circuit power supply line 52 and the first power supply line 3 which, in this case, is coupled to ground. Electrostatic discharge protection zener diodes ZD4, ZD5 and ZD6 are coupled between the logic circuitry power supply line 52 and the first power supply 3, between the gate terminal GT and the first power supply line 3 between the input line of the logic circuitry 10a and the first power supply line 3.

A resistance $R_{IG}$ is coupled in the gate voltage supply line GS between the gate terminal GT and the connection J3 to gate voltage supply line GS of the voltage clamping arrangement 50. The value of the resistance $R_{IG}$ should be high compared to that of the resistor R13. A further n-channel enhancement mode IGFET M15 is coupled in series with a resistor R14 between a junction J4 in the gate voltage supply line GS and the first voltage supply line 3. The control electrode g of the IGFET M15 is coupled to another output Q of the logic circuitry 10b. The output Q is the inverse of the output $\overline{Q}$ (Qbar) coupled to the control gate of the IGFET M13 so that the IGFET M15 is conducting when the IGFET M13 is non-conducting and vice-versa.

The logic circuitry 10b will supply a high output signal Q when it receives an input signal on line 51 indicating that there is a fault condition existing in the protected switch 1c. Such a fault condition signal may be an indication that the power MOSFET 2 is experiencing an excessive temperature (over temperature) or that there is an overload condition. A high output signal Q causes the signal $\overline{Q}$ to the control electrode g of the IGFET M13 to go low so that the IGFET M13 is rendered non-conducting causing the voltage at the control electrode g of the IGFET M14 to rise causing the IGFET M14 to conduct so allowing the IGFET M14 to discharge the insulated gate electrode G of the power MOSFET 2 to switch off the power MOSFET 2. The high signal Q also turns on the IGFET M15 which therefore assists in a discharge of the insulated gate controlled electrode G of the power MOSFET.

The IGFET M15 is not strictly necessary and may be omitted. However, because the IGFET M15, unlike the IGFET M14, should have the full protection supply voltage available at its control electrode g, the IGFET M15 should be able to turn the power MOSFET to off more quickly than the IGFET M14 so increasing the rapidity of the response of the protected switch 1c to the detection of a fault condition.

In addition, of course, the power semiconductor device may be other than a power MOSFET and could be, for example, formed as an IGBT simply by reversing the conductivity type of the region 21 in FIG. 2, provided, of course, appropriate measures are taken to inhibit undesired parasitic bipolar action where the circuit of, for example, FIG. 1 is also integrated in the same semiconductor body. Similarly, any of the three-terminal normally off devices, for example the IGFETs M1 to M14, may be formed as different types of threeterminal normally off devices, for example as bipolar transistors.

Of course, the conductivity types and polarities given above may be reversed and the semiconductor body and any thin film semiconductor layers may be formed of a semiconductor other than silicon for example germanium or a combination of semiconductor materials or even a suitable III–V semiconductor material. In addition, amorphous or microcrystalline semiconductor materials can be used in place of polycrystalline semiconductor materials.

From reading the present disclosure, other modifications and variations will be apparent to persons skilled in the art. Such modifications and variations may involve other features which are already known in the art and which may be used instead of or in addition to features already described herein. Although claims have been formulated in this application to particular combinations of features, it should be understood that the scope of the disclosure of the present application also includes any novel feature or combination of features disclosed herein either explicitly or implicitly, whether or not relating to the same invention as presently claimed in any claim and whether or not it mitigates any or all of the same technical problems as does the presently claimed invention. The applicants hereby give notice that new claims may be formulated to such features and/or combinations of such features during prosecution of the present application or of any further application derived therefrom.

I claim:

1. A protected switch, comprising:
    a first semiconductor device having a first main electrode coupled to a first voltage supply line, a second main electrode coupled to a first terminal which is coupled via a load to a second voltage supply line, and an insulated gate electrode coupled to a control terminal for receiving a gate control signal to enable conduction of the first semiconductor device;
    a control arrangement for controlling operation of the first semiconductor device, wherein the control arrangement comprises a normally off second semiconductor device having a first main electrode coupled to the insulated gate electrode of the first semiconductor device, a second main electrode coupled to the second main electrode of the first semiconductor device, and a control electrode coupled via a high impedance path to the insulated gate electrode of the first semiconductor device, thereby causing the normally off second semiconductor device to be rendered conducting when a gate control signal is supplied to the insulated gate electrode of the first semiconductor device via the control terminal to enable conduction of the first semiconductor device;
    wherein the control arrangement further comprises disabling means for inhibiting conduction of the normally off second semiconductor device during normal operation of the first semiconductor device, the disabling means comprising a normally off third semiconductor device having a first main electrode coupled to the control electrode of the normally off second semiconductor device, a second main electrode coupled to the second main electrode of the first semiconductor device, and a control electrode; and means for supplying a signal to the control electrode of the third semiconductor device for rendering the third semiconductor device conducting during normal operation of the first semiconductor device, thereby inhibiting conduction of the normally off second semiconductor device; and wherein the disabling means comprises a comparator which includes first and second conductive paths and means for comparing the voltages at respective corresponding locations on the first and second conductive paths and for providing an output signal to render the third semiconductor device conducting, to thereby inhibit conduction of the normally off second semiconductor device, when a predetermined relationship is detected between the compared voltages.

2. A protected switch according to claim 1, wherein the first and second conductive paths comprise first and second additional semiconductor devices respectively with each additional semiconductor device having a control electrode and a conductance dependent upon the voltage applied to the control electrode, the means for modifying the conductance of at least a part of the first path comprises means for supplying a first voltage to the control electrode of the first additional semiconductor device when the voltage at the first terminal is less than the voltage at the more positive one of the first and second voltage supply lines and the means for modifying the conductance of at least a part of the second path comprises means for supplying a second voltage to the control electrode of the second additional semiconductor device when the voltage at the first terminal is greater than the voltage at the other less positive one of the first and second voltage supply lines.

3. A protected switch according to claim 2, wherein the means for supplying the first voltage to the control electrode of the first additional semiconductor device comprises a first semiconductor switch for coupling a first current source to a first resistive element to develop the first voltage across the first resistive element when the voltage at the first terminal is less than the voltage at the more positive one of the first and second voltage supply lines.

4. A protected switch according to claim 2, wherein the means for supplying a second voltage to the control electrode of the second additional semiconductor device comprises means for coupling a second current source to a second resistive element when the voltage at the first terminal is greater than the voltage at the less positive one of the first and second voltage supply lines.

5. A protected switch according to claim 4, wherein the means for coupling the second current source to the second resistive element comprises a diode chain.

6. A protected switch according to claim 2, wherein the first and second additional semiconductor devices comprise normally on devices.

7. A protected switch according to claim 1, wherein the first and second conductive paths comprise first and second arms, respectively, of a bridge having an output coupled to one of the first and second arms.

8. A protected switch according to claim 7, wherein the first and second arms of the bridge each comprise a respective transistor having first and second main electrodes and a control electrode, each transistor being coupled between an auxiliary voltage supply line and the second main electrode of the power first semiconductor device by a respective resistor and the associated one of the first and second additional semiconductor devices, the control electrodes of the two transistors of the bridge being coupled together, one of the two transistors being diode-connected and the output being coupled to one of the first and second main electrodes of the other one of the two transistors.

9. A protected switch according to claim 1, wherein the second semiconductor device comprises an enhancement mode insulated gate field effect transistor.

10. A protected switch according to claim 1, wherein the switch is included in the electrical system of a motor vehicle.

11. A protected switch according to claim 1, wherein the disabling means further comprises means for modifying the conductance of at least a part of the first conductive path when the voltage at the first terminal is less than the voltage at the more positive one of the first and second voltage supply lines, and means for modifying the conductance of at least a part of the second conductive path when the voltage at the first terminal is greater than the voltage at the other less positive one of the first and second voltage supply lines.

12. A protected switch according to claim 1, wherein the first semiconductor device comprises a power semiconductor device.

13. A protected switch according to claim 12, wherein the power semiconductor device comprises a power MOSFET.

14. A protected switch according to claim 11, wherein the first semiconductor device comprises a power semiconductor device.

15. A protected switch according to claim 11, wherein the first semiconductor device comprises a power MOSFET.

\* \* \* \* \*